United States Patent
Smeys et al.

(10) Patent No.: US 10,651,151 B2
(45) Date of Patent: May 12, 2020

(54) 3D INTEGRATION USING AL—GE EUTECTIC BOND INTERCONNECT

(71) Applicant: InvenSense, Inc., San Jose, CA (US)

(72) Inventors: Peter Smeys, San Jose, CA (US); Mozafar Maghsoudnia, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 61 days.

(21) Appl. No.: 15/663,242

(22) Filed: Jul. 28, 2017

(65) Prior Publication Data
US 2017/0330863 A1 Nov. 16, 2017

Related U.S. Application Data

(62) Division of application No. 15/040,823, filed on Feb. 10, 2016, now Pat. No. 9,754,922.

(Continued)

(51) Int. Cl.
*H01L 21/00* (2006.01)
*H01L 25/065* (2006.01)
(Continued)

(52) U.S. Cl.
CPC .......... *H01L 25/0657* (2013.01); *H01L 24/05* (2013.01); *H01L 24/13* (2013.01); *H01L 24/16* (2013.01); *H01L 24/81* (2013.01); *H01L 24/94* (2013.01); *H01L 25/50* (2013.01); *H01L 2224/056* (2013.01); *H01L 2224/05571* (2013.01); *H01L 2224/05572* (2013.01); *H01L 2224/05573* (2013.01); *H01L 2224/05624* (2013.01); *H01L 2224/131* (2013.01);
(Continued)

(58) Field of Classification Search
CPC ..... H01L 25/0657; H01L 25/50; H01L 24/05; H01L 24/13; H01L 24/81; H01L 24/16; H01L 24/94; H01L 2224/48247; H01L 23/50; H01L 23/49811
See application file for complete search history.

(56) References Cited

U.S. PATENT DOCUMENTS 3,668,025 A * 6/1972 Blum .................... H01L 21/00
438/537
3,728,090 A 4/1973 Hoffman et al.
(Continued)

FOREIGN PATENT DOCUMENTS

CN 101656197 A 2/2010
KR 20140147588 A 12/2014
(Continued)

OTHER PUBLICATIONS

EP Communication Pursuant to Rules 161(1) and 162 EPC dated Sep. 19, 2017 in EP Application No. 16707311.3. 2 pages.
(Continued)

*Primary Examiner* — Hoa B Trinh

(57) ABSTRACT

A method includes aligning a germanium feature on a first CMOS wafer with an aluminum feature on a second CMOS wafer. The aluminum feature and the germanium feature are pressed together. A eutectic bond is formed connecting the aluminum feature to the germanium feature. The eutectic bond has a melting point which is lower than the melting point of aluminum and the melting point of germanium.

18 Claims, 8 Drawing Sheets

Related U.S. Application Data

(60) Provisional application No. 61/115,093, filed on Feb. 11, 2015.

(51) Int. Cl.
*H01L 25/00* (2006.01)
*H01L 23/00* (2006.01)

(52) U.S. Cl.
CPC ............... *H01L 2224/13023* (2013.01); *H01L 2224/13082* (2013.01); *H01L 2224/13124* (2013.01); *H01L 2224/16111* (2013.01); *H01L 2224/16147* (2013.01); *H01L 2224/16502* (2013.01); *H01L 2224/81* (2013.01); *H01L 2224/81191* (2013.01); *H01L 2224/81805* (2013.01); *H01L 2224/81815* (2013.01); *H01L 2224/81906* (2013.01); *H01L 2224/94* (2013.01); *H01L 2225/06513* (2013.01); *H01L 2924/01032* (2013.01); *H01L 2924/01322* (2013.01)

(56) References Cited

U.S. PATENT DOCUMENTS

| | | |
|---|---|---|
| 5,083,466 A | 1/1992 | Holm-Kennedy et al. |
| 5,153,917 A | 10/1992 | Kato |
| 5,249,732 A | 10/1993 | Thomas |
| 5,359,893 A | 11/1994 | Dunn |
| 5,367,194 A | 11/1994 | Beatty |
| 5,426,070 A | 6/1995 | Shaw et al. |
| 5,481,283 A | 1/1996 | Watanabe et al. |
| 5,481,284 A | 1/1996 | Kitahara et al. |
| 5,481,285 A | 1/1996 | Pies et al. |
| 5,481,914 A | 1/1996 | Ward |
| 5,485,032 A | 1/1996 | Schepis et al. |
| 5,656,778 A | 8/1997 | Roszhart |
| 5,659,195 A | 8/1997 | Kaiser et al. |
| 5,693,574 A | 12/1997 | Schuster et al. |
| 5,703,293 A | 12/1997 | Zabler et al. |
| 5,780,740 A | 7/1998 | Lee et al. |
| 5,892,575 A | 4/1999 | Marino |
| 5,895,850 A | 4/1999 | Buestgens |
| 5,897,341 A | 4/1999 | Love et al. |
| 5,915,168 A | 6/1999 | Salatino et al. |
| 5,992,233 A | 11/1999 | Clark |
| 5,996,409 A | 12/1999 | Funk et al. |
| 6,036,872 A | 3/2000 | Wood et al. |
| 6,122,961 A | 9/2000 | Geen et al. |
| 6,128,961 A | 10/2000 | Haronian |
| 6,189,381 B1 | 2/2001 | Huang et al. |
| 6,199,748 B1 | 3/2001 | Zhu et al. |
| 6,229,190 B1 | 5/2001 | Bryzek et al. |
| 6,250,157 B1 | 6/2001 | Touge |
| 6,391,673 B1 | 5/2002 | Ha et al. |
| 6,426,687 B1 | 7/2002 | Osborn |
| 6,430,998 B2 | 8/2002 | Kawai et al. |
| 6,433,411 B1 | 8/2002 | Degani et al. |
| 6,448,109 B1 | 9/2002 | Karpman |
| 6,452,238 B1 | 9/2002 | Orcult et al. |
| 6,479,320 B1 | 11/2002 | Gooch |
| 6,480,320 B2 | 11/2002 | Nasiri |
| 6,487,908 B2 | 12/2002 | Geen et al. |
| 6,508,122 B1 | 1/2003 | McCall et al. |
| 6,513,380 B2 | 2/2003 | Reeds, III et al. |
| 6,519,075 B2 | 2/2003 | Carr et al. |
| 6,528,344 B2 | 3/2003 | Kang |
| 6,528,887 B2 | 3/2003 | Daneman et al. |
| 6,533,947 B2 | 3/2003 | Nasiri et al. |
| 6,555,417 B2 | 4/2003 | Spooner et al. |
| 6,559,530 B2 | 5/2003 | Hinzel et al. |
| 6,621,137 B1 | 9/2003 | Ma et al. |
| 6,635,509 B1 | 10/2003 | Ouellet |
| 6,650,455 B2 | 11/2003 | Miles |
| 6,660,564 B2 | 12/2003 | Brady |
| 6,686,639 B1 | 2/2004 | Tsai |
| 6,770,569 B2 | 8/2004 | Foerstner et al. |
| 6,794,272 B2 | 9/2004 | Turner et al. |
| 6,796,178 B2 | 9/2004 | Jeong et al. |
| 6,808,955 B2 | 10/2004 | Ma |
| 6,852,926 B2 | 2/2005 | Ma et al. |
| 6,918,297 B2 | 7/2005 | MacGugan |
| 6,936,491 B2 | 8/2005 | Partridge et al. |
| 6,936,494 B2 | 8/2005 | Cheung |
| 6,939,473 B2 | 9/2005 | Nasiri et al. |
| 6,943,484 B2 | 9/2005 | Clark et al. |
| 7,004,025 B2 | 2/2006 | Tamura |
| 7,028,547 B2 | 4/2006 | Shiratori et al. |
| 7,104,129 B2 | 9/2006 | Nasiri et al. |
| 7,196,404 B2 | 3/2007 | Schirmer et al. |
| 7,247,246 B2 | 7/2007 | Nasiri et al. |
| 7,642,692 B1 | 1/2010 | Pulskamp |
| 7,907,838 B2 | 3/2011 | Nasiri et al. |
| 8,220,330 B2 | 7/2012 | Miller et al. |
| 8,236,577 B1 | 8/2012 | Hsu et al. |
| 8,288,191 B2 * | 10/2012 | Martin ................ B81C 1/00269 438/113 |
| 8,461,017 B2 | 6/2013 | Sadaka et al. |
| 8,525,278 B2 | 9/2013 | Chu et al. |
| 8,580,594 B2 | 11/2013 | Huang et al. |
| 8,790,946 B2 | 7/2014 | Huang et al. |
| 8,810,027 B2 | 8/2014 | Cheng et al. |
| 2002/0051258 A1 | 5/2002 | Tamura |
| 2003/0074967 A1 | 4/2003 | Tang et al. |
| 2003/0110858 A1 | 6/2003 | Kim et al. |
| 2003/0164041 A1 | 9/2003 | Jeong et al. |
| 2004/0055380 A1 | 3/2004 | Shcheglov et al. |
| 2005/0081633 A1 | 4/2005 | Nasiri et al. |
| 2005/0170656 A1 | 8/2005 | Nasiri et al. |
| 2012/0013013 A1 | 1/2012 | Sadaka et al. |
| 2012/0074554 A1 | 3/2012 | Cheng et al. |
| 2013/0037891 A1 | 2/2013 | Huang et al. |
| 2013/0043547 A1 | 2/2013 | Chu et al. |
| 2013/0203199 A1 | 8/2013 | Huang et al. |
| 2014/0042562 A1 | 2/2014 | Chu et al. |
| 2014/0045301 A1 | 2/2014 | Liu et al. |
| 2014/0306341 A1 | 10/2014 | Hou et al. |
| 2016/0341616 A1 * | 11/2016 | Classen ................ G01L 9/0042 |

FOREIGN PATENT DOCUMENTS

| | | |
|---|---|---|
| TW | 201209897 A | 3/2012 |
| WO | 2000/029822 A1 | 5/2000 |
| WO | 2002/042716 A2 | 5/2002 |
| WO | 2003/038449 A1 | 10/2003 |
| WO | 2014078134 A3 | 7/2014 |

OTHER PUBLICATIONS

CN Office Action dated Jul. 14, 2016 in CN Application No. 201510523999.2, Includes English Translation. 11 pages.
EP Response dated Feb. 14, 2011 in EP Application No. 06737697.0. 7 pages.
EP Supplemental Search Report dated Jul. 20, 2010 in EP Application No. 06737697.0. 7 pages.
Mems Group et al., "Metal Based Wafer Bonding Techniques for Wafer Level Packaging," Dec. 1, 2009, XP055271501, Retrieved from https://www.suss.com/fileadmin/user_upload/technical_publication/WP_Metal_Based_Wafer_Bonding_Techniques_for_Wafer_Level_Packaging_1209.pdf. 11 pages.
PCT International Search Report and Written Opinion dated Feb. 7, 2008 in International Application No. PCT/US06/44919. 5 pages.
PCT International Search Report and Written Opinion dated May 20, 2016 in International Application No. PCT/US16/017418. 16 pages.
PCT International Preliminary Report on Patentability (Chapter I) dated Aug. 24, 2017 in International Application No. PCT/US16/017418. 11 pages.
Sood et al., "Al—Ge Eutectic Wafer Bonding and Bond Characterization for CMOS Compatible Wafer Packaging," SVTC Technologies, May 8, 2010, pp. 1-8. 8 pages.

(56) References Cited

OTHER PUBLICATIONS

Vu et al., "Patterned Eutectic Bonding with Al/Ge Thin Films for Microelectomechanical Systems," Northeastern University, Boston, Massachusetts, May 31, 1996. 7 pages.

* cited by examiner

3D INTEGRATION USING AL—GE EUTECTIC BOND INTERCONNECT

CROSS-REFERENCE TO RELATED APPLICATIONS

This application is a divisional of prior application Ser. No. 15/040,823, filed Feb. 10, 2016, which claims the benefit of U.S. Provisional Patent Application Ser. No. 62/115,093 filed Feb. 11, 2015, entitled "3D INTEGRATION USING Al-Ge EUTECTIC BOND INTERCONNECT".

BACKGROUND

CMOS ("complementary metal-oxide semiconductor") compatible wafer-wafer bonding is desirable for wafer-level-packaging. Its use has been demonstrated in a variety of different technologies, however solutions are limited by large bond size and high parasitic capacitance. For example, larger bonds such as microbumps occupy a large amount of space. As a result, the number of connections between wafers may be limited for direct wafer-wafer stacking. Therefore, a need remains for a robust wafer level integration that can allow for simultaneous wafer-level-packaging and high density electrical interconnects which optimize power, performance, and size of stacked solutions.

SUMMARY

Provided herein is method including aligning a germanium feature on a first CMOS wafer with an aluminum feature on a second CMOS wafer. The aluminum feature and the germanium feature are pressed together. A eutectic bond is formed connecting the aluminum feature to the germanium feature. The eutectic bond has a melting point which is lower than the melting point of aluminum and the melting point of germanium.

These and other features and aspects of the concepts described herein may be better understood with reference to the following drawings, description, and appended claims.

DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

CMOS wafers may be vertically stacked (e.g. 3D integration), a first wafer on top of a second wafer. The CMOS wafers may be electrically connected to each other using TSV ("Through Silicon Via") or microbump connections. However, TSV and microbump connections are limited due to large size and high parasitic elements (e.g. resistance, capacitance, etc.). Therefore, provided herein are embodiments for 3D integration of CMOS wafer-wafer bonding using aluminum-germanium ("Al-Ge") eutectic bond interconnects. The small size of the eutectic bonds, relative to TSV and microbump, enables a high density of interconnects between stacked CMOS with low parasitic capacitance. As a result, the Al-Ge eutectic bond interconnects enable optimization of power, performance, and size of the stacked CMOS.

Figure 1:
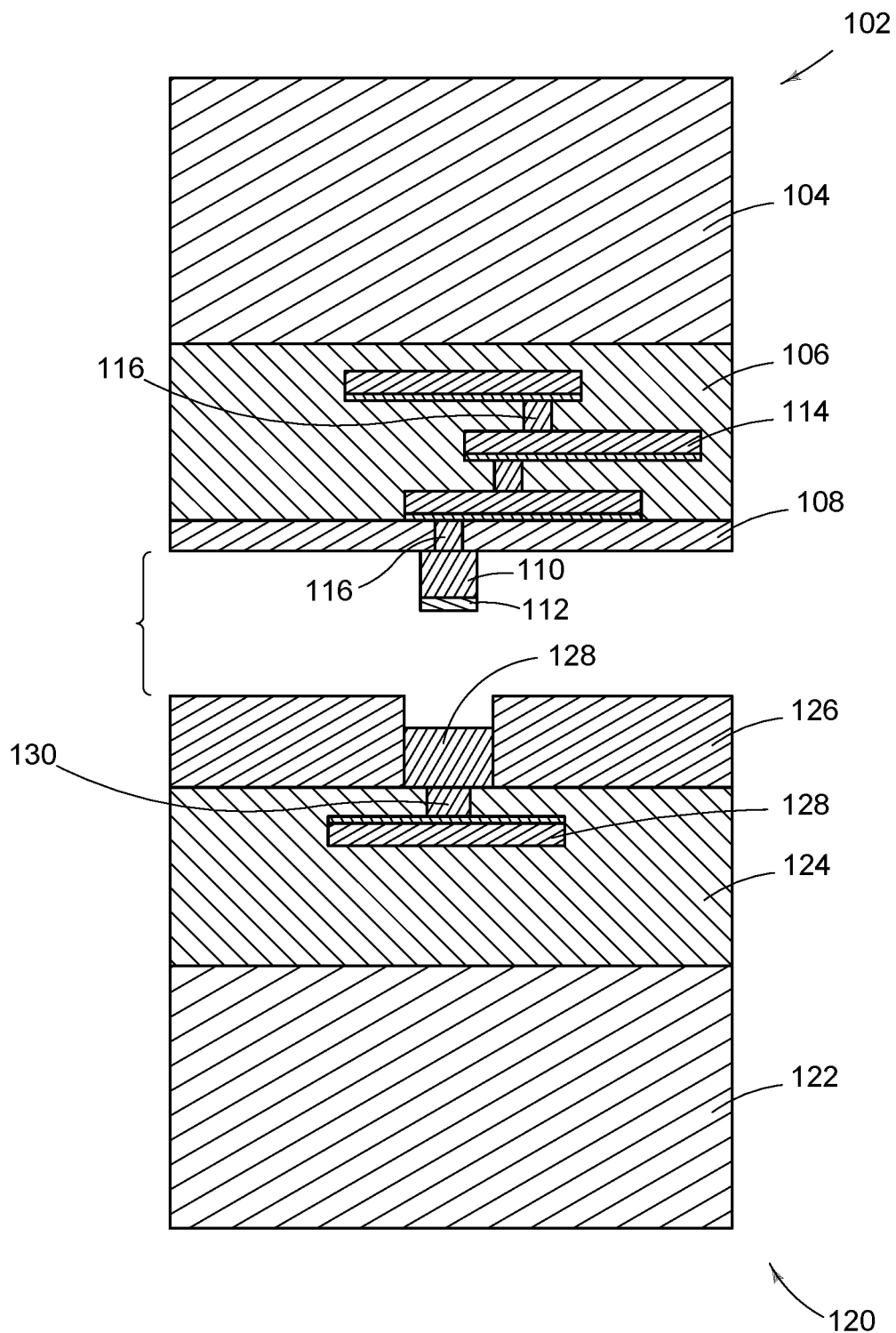
FIG. 1 shows two CMOS wafers aligned for bonding according to one aspect of the present embodiments.

Referring now to FIG. 1, two CMOS wafers aligned for bonding are shown according to one aspect of the present embodiments. A first CMOS wafer 102 includes a substrate 104 top layer, an inter layer dielectric ("ILD") middle layer 106, and a passivation bottom layer 108. The first CMOS wafer 102 also includes an aluminum standoff 110, below the passivation bottom layer 108. The aluminum standoff 110 includes a germanium layer 112.

The functionality of the first CMOS wafer 102 is not limited. For example, various non-limiting embodiments may include advanced CMOS SOC ("system on chip"), analog (e.g. SERDES ("serializer/deserializer")) chip, memory chip, FPGA ("field programmable gate array"), FPGA configuration memory, LUTs ("look up table"), etc.

The ILD middle layer 106 may contain one or more structures including, for example, metal connectors 114. In various embodiments, tungsten vias 116 connect the metal connectors 114 to each other and/or the aluminum standoff 110. It is understood that in various embodiments, the tungsten vias 116 may be any metal, alloy, or electrically conductive material. It is further understood that in various embodiments, the interconnects are not limited to aluminum and may include other metals (e.g. copper). Furthermore, embodiments of the present invention are not limited to including vias (e.g. tungsten vias 116).

The passivation bottom layer 108 may include one or more layers. For example, the passivation bottom layer 108 may include an $SiO_2$ layer and an SiN layer. In various embodiments, the $SiO_2$ layer is disposed between the ILD middle layer 106 and the SiN layer. It is understood that the $SiO_2$ layer and the SiN layer are merely exemplary, and the passivation bottom layer 108 may include other compounds, combinations, or number of layers.

A second CMOS wafer 120, includes a substrate bottom layer 122, an ILD middle layer 124, and a passivation top layer 126. The second CMOS wafer 120 also includes an aluminum well 128, within the passivation top layer 126. In the present embodiment, the aluminum well 128 is a depression within the passivation top layer 126, wherein the depression includes an aluminum portion (e.g. an aluminum surface) for electrically connecting to elements of the second CMOS wafer 120. In various embodiments the aluminum well 128 is created by opening the passivation top layer 126. The aluminum layer 128 includes an aluminum portion for electrically conducting to elements of the second CMOS wafer 120. As will be discussed later, the aluminum portion may also be replaced with germanium or coated with germanium.

The functionality of the second CMOS wafer 120 is not limited. For example, various non-limiting embodiments may include advanced CMOS SOC, analog (e.g. SERDES) chip, memory chip, FPGA, FPGA configuration memory, LUTs, etc.

The ILD middle layer 124 may contain one or more structures including, for example, metal connectors 128. In various embodiments, one or more tungsten vias 130 connect the metal connectors 128 to each other (not shown) and/or the aluminum well 128 (e.g. exposed aluminum surface). It is understood that in various embodiments, the tungsten vias 130 may be any metal, alloy, or electrically conductive material.

The passivation top layer 126 may include one or more layers. For example, the passivation top layer 126 may include an $SiO_2$ layer and an SiN layer. In various embodiments, the $SiO_2$ layer is disposed between the ILD middle layer 124 and the SiN layer.

Figure 2:
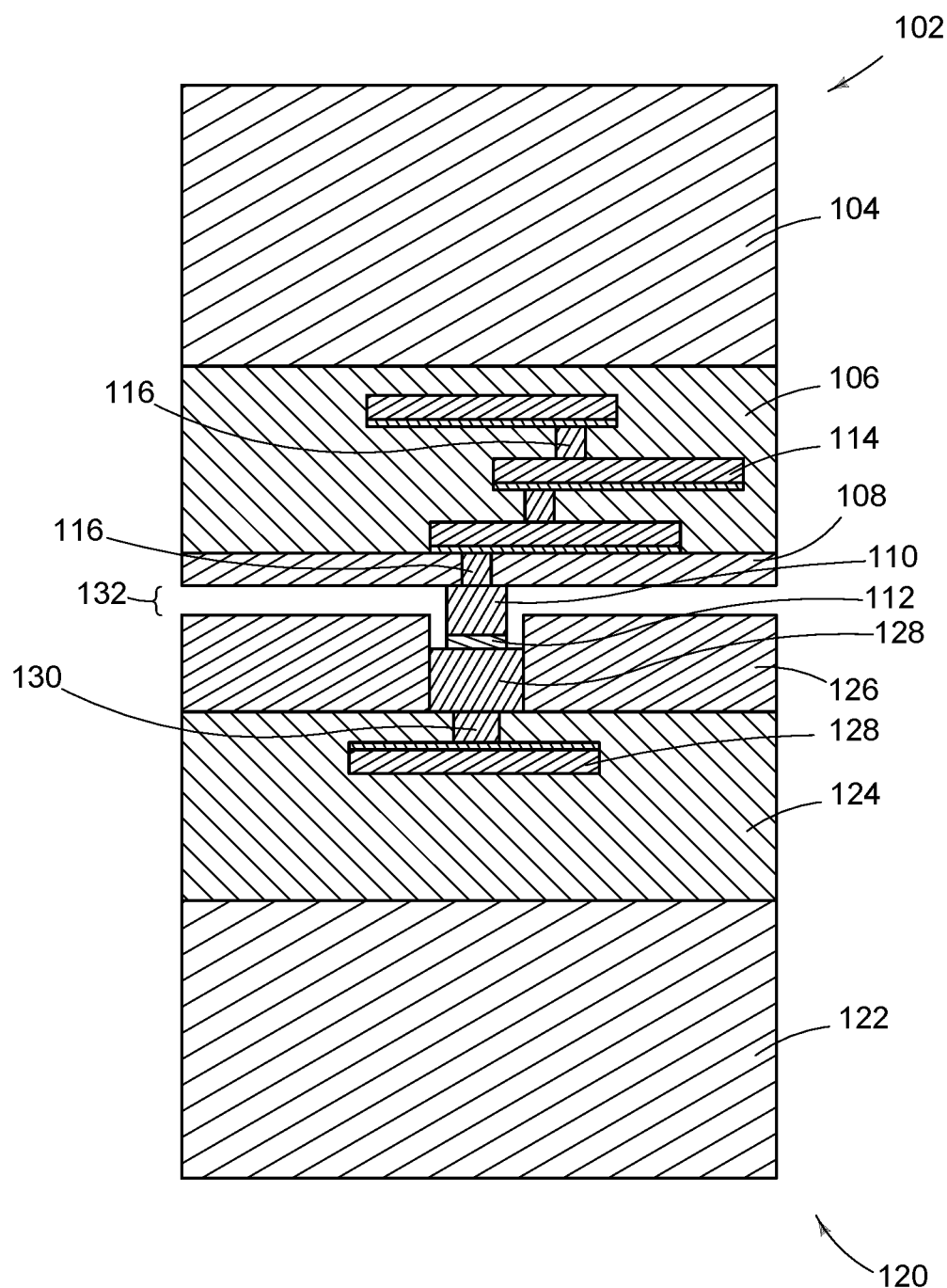
FIG. 2 shows two CMOS wafers with contact between the germanium layer and the aluminum well according to one aspect of the present embodiments.

Referring now to FIG. 2, the two CMOS wafers with contact between the germanium layer 112 and the aluminum well 128 (e.g. exposed aluminum surface) are shown according to one aspect of the present embodiments. The first CMOS wafer 102 has been aligned with the second CMOS wafer 120, such that the aluminum standoff 110 with the germanium layer 112 contacts the aluminum well 128. As a result, aluminum and germanium are now in contact and prepared for eutectic bonding.

In the present embodiment, the aluminum standoff 110 with the germanium layer 112 is a first feature including a height, and the aluminum well 128 is a second feature including a depth. As a result, in order for the first CMOS wafer 102 to be bonded with the second CMOS wafer 120, the present embodiment includes the first feature with a height (e.g. less than 500 Å) that is greater than or equal to the depth of the second feature. Further embodiments may include different features with different combinations of heights and depths. For example, both wafers may include aligned standoffs, as described below.

Although the first CMOS wafer 102 includes the aluminum standoff 110 with the germanium layer 112, and the second CMOS wafer 120 includes the aluminum well 128, various embodiments may include other combinations. For example, one embodiment may include a germanium standoff and an aluminum well. Another embodiment may include an aluminum standoff and an aluminum well with a germanium layer. A still further embodiment may include a germanium standoff, a germanium well, and an aluminum layer on either the germanium standoff or the germanium well.

Further embodiments may include a standoff instead of a well. For example, the first CMOS wafer may include an aluminum standoff with a germanium layer. The second CMOS wafer may include an aluminum standoff (instead of an aluminum well). In a further example, the first CMOS wafer may include a germanium standoff and the second CMOS wafer may include an aluminum standoff. In a still further example, the first CMOS wafer may include a germanium standoff, the second CMOS wafer may include a germanium standoff, and an aluminum layer may be disposed on either of the germanium standoffs.

Therefore, it is understood that the alignment and contact between the first CMOS wafer 102 and the second CMOS wafer 120 bring aluminum and germanium features of either structure into contact. Thus, the first CMOS wafer 102 and the second CMOS wafer 120 are prepared for eutectic bonding to each other. As will be described below with reference to later figures, the height of the aluminum standoff may be adjusted to control a standoff distance 132 between the first CMOS wafer 102 and the second CMOS wafer 120. For example, the standoff distance 132 may range from 0 to 2000 Å. However, it is understood that in various embodiments the standoff distance 132 is not limited, and my greatly exceed 2000 Å.

Figure 3:
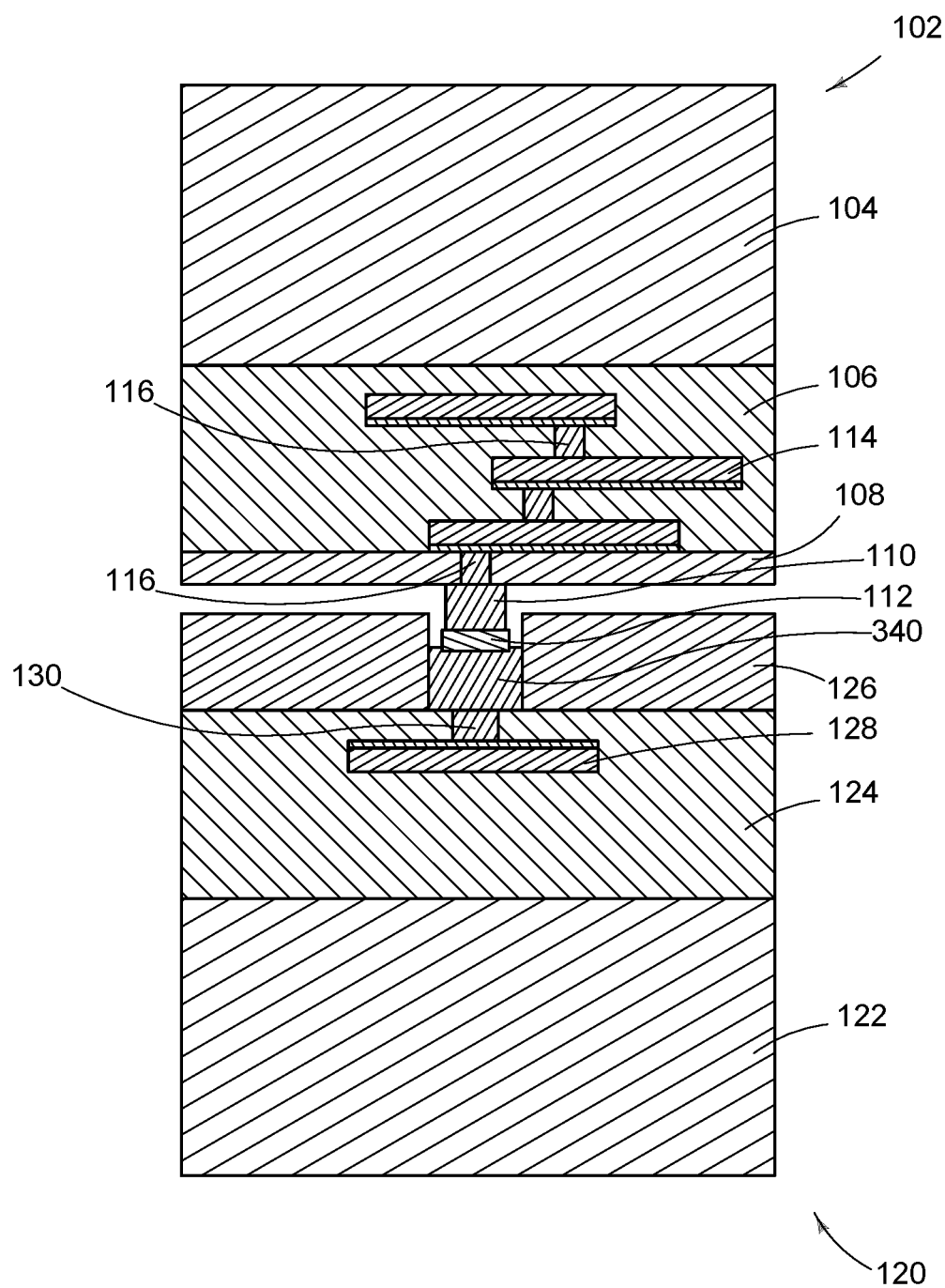
FIG. 3 shows two CMOS wafers with an Al-Ge eutectic bond according to one aspect of the present embodiments.

Referring now to FIG. 3, the two CMOS wafers with an Al-Ge eutectic bond 340 are shown according to one aspect of the present embodiments. During the bonding process, heat is applied in order to bring the temperature up to at least the eutectic melting point and form the Al-Ge eutectic bond. It is understood that the eutectic melting point is lower than the melting point of aluminum and lower than the melting point of germanium. In addition, pressure is applied to the first CMOS wafer 102 and the second CMOS wafer 120 in order to press aluminum and germanium features together. In the present embodiment, the aluminum standoff 110 with the germanium layer 112 is pressed to the aluminum well 128.

Sufficient pressure is applied to aid in the eutectic bonding process, however too much pressure may cause melted Al-Ge to spill out of the well 128 and onto the passivation top layer 126. Therefore, the pressure is controlled to maintain the Al-Ge eutectic bond 340 substantially to the contact points between the first CMOS wafer 102 and the second CMOS wafer 120. For example, in the present embodiment the Al-Ge eutectic bond 340 is confined to the aluminum well 128. In a further example, the width of the eutectic bond 340 is narrower than the width of a first feature (e.g. the aluminum standoff 110) and narrower than the width of a second feature (e.g. the aluminum well 128).

Various embodiments may use different methods for reaching the Al-Ge eutectic melting point. For example in some embodiments, the temperature may be raised in step fashion to below the eutectic melting point, the surfaces brought into contact, and then the temperature raised again. It is understood that above examples are merely for illustration and should not be limiting.

After melting, the Al-Ge eutectic bond 340 is formed between a first feature on the first CMOS wafer 102 and a second feature on the second CMOS wafer 120. As previously discussed, some non-limiting examples of first and second features may include: an aluminum standoff, a germanium standoff, an aluminum standoff with a germanium layer, a germanium standoff with an aluminum layer, an aluminum well, a germanium well, an aluminum well with a germanium layer, a germanium well with an aluminum layer, etc. As a result, the Al-Ge eutectic bond 340 may include any combination of aluminum and germanium features.

Further embodiments may also use elements other than aluminum and germanium. Any elements that form a eutectic bond may be used. For example, CMOS wafers may form eutectic bonds with gold features and silicon features. In a further examples, CMOS wafers may form eutectic bonds with copper features and tin features. In various examples, CMOS wafers may include a number of different eutectic combinations for forming different eutectic interconnects between two CMOS wafers. In some embodiments the eutectic bonding temperature is lower than the maximum temperature a CMOS circuit can withstand without being damaged during processing (e.g. <430C).

Figure 4:
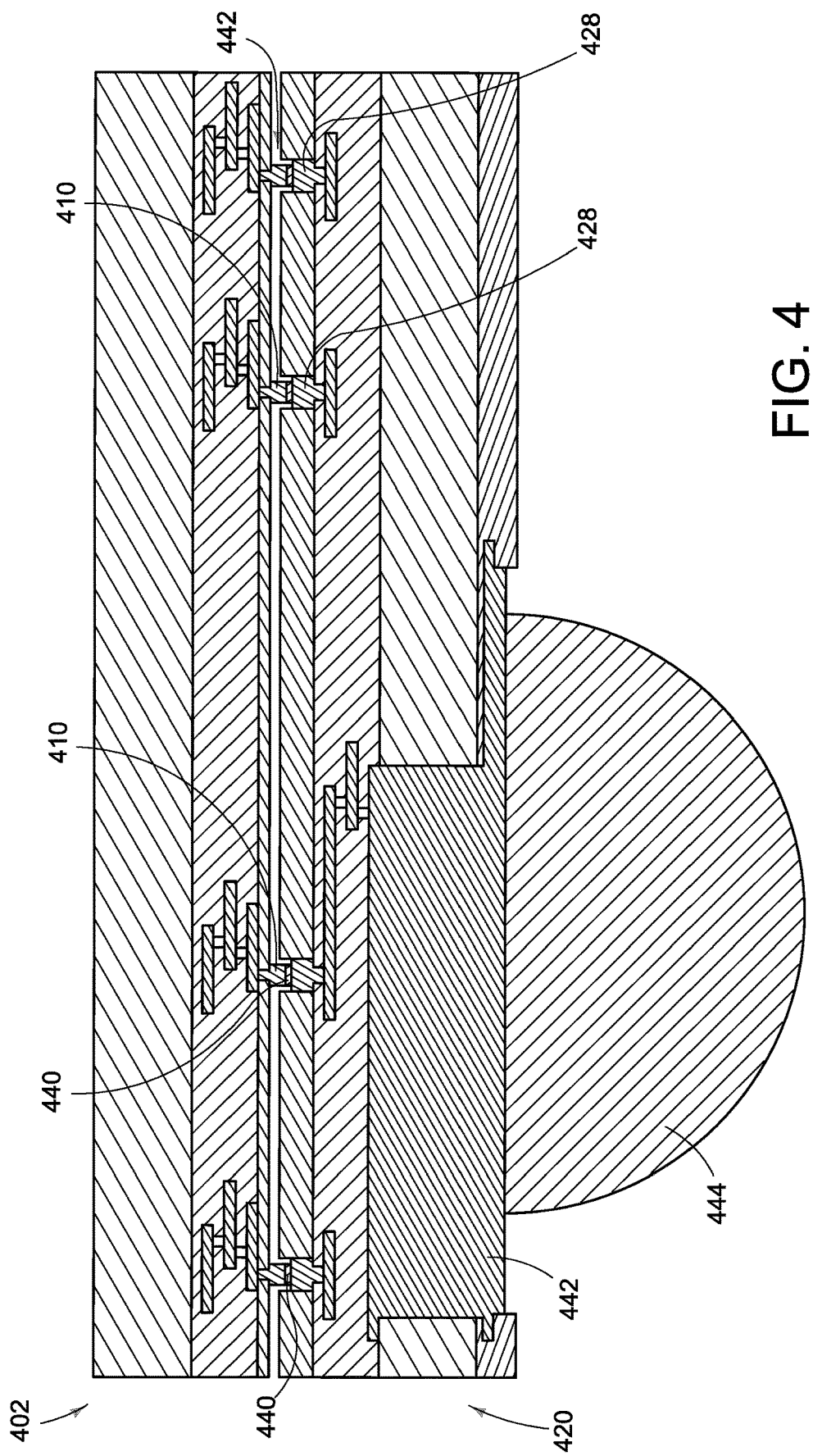
FIG. 4 shows two CMOS wafers with a number of interconnects according to one aspect of the present embodiments.

Referring now to FIG. 4, two CMOS wafers with a number of interconnects 441 are shown according to one aspect of the present embodiments. In the present embodiment, the interconnects 441 include standoffs 410, Al-Ge eutectic bonds 440, and wells 428. Various embodiments may include interconnects of various structures and forms that electrically interconnect to each other through Al-Ge eutectic bonds.

A first CMOS wafer 402 and a second CMOS wafer 420 have been bonded together with a number of the Al-Ge eutectic bonds 440. In addition a TSV 442 and a solderbump 444 are electrically connected through the second CMOS wafer 420 to the Al-Ge eutectic bonds 440.

It is understood that in various embodiments CMOS wafers may include mechanical imperfections. For example, CMOS wafers may not be flat and may include warpage, non-uniformity, and native oxides that need to be broken through. Therefore in various embodiments, enough force to overcome the mechanical imperfections of one or more CMOS wafers is applied.

For example, in the case of warpage, one or more standoffs 410 and wells 428 may contact one another before other standoffs 410 and wells 428, thereby preventing the other standoffs 410 and wells 428 from contacting. Therefore, additional pressure (e.g. force) is applied to the first CMOS wafer 402 and the second CMOS wafer 420 in order to bring all of the standoffs 410 and wells 428 into contact. However, the pressure is also controlled to mitigate overly spreading the Al-Ge eutectic bonds 440 (as previously discussed).

The TSV 442, the solder bump 444, and the interconnects 441 are figuratively illustrated. However, it is understood that the interconnects 441 are much smaller than the TSV 442 and the solderbump 444. As a result, the density of the interconnects 441 may be much greater than the possible density of TSVs or solderbump. As illustrated, a number of interconnects 441 may fit within the area of a single TSV or microbump. For example in one non-limiting embodiment, a TSV or microbump could range in the tens of microns (e.g. from 10 to 50 microns or more) while a eutectic interconnect could range from 1 to 2 microns or even sub-micron. Various embodiments may also include combinations of different interconnects. For example, CMOS wafers may include any combination interconnects (e.g. eutectic bonds, TSVs, microbumps, wire bonding, etc.).

The small size of the interconnects 441 and high density have many advantages. For example, parasitic capacitance of the interconnects 441 is greatly reduced from the TSVs or microbumps. In addition, the small size of the interconnects 441 enable new integration methods of stacking die (e.g. partitioning of interconnect and IP blocks between multiple die to optimize power, performance, and size of the stacked solution). In various embodiments, heterogeneous integration enables partitioning of interconnect and IP ("intellectual property") blocks using cost optimized technologies. For example, a 14 nm microprocessor SOC may be bonded to 65 nm memory, 40 nm SERDES, or 28 nm SERDES. In further example, FPGA configuration memory blocks may be segregated from LUTs.

Figure 5:
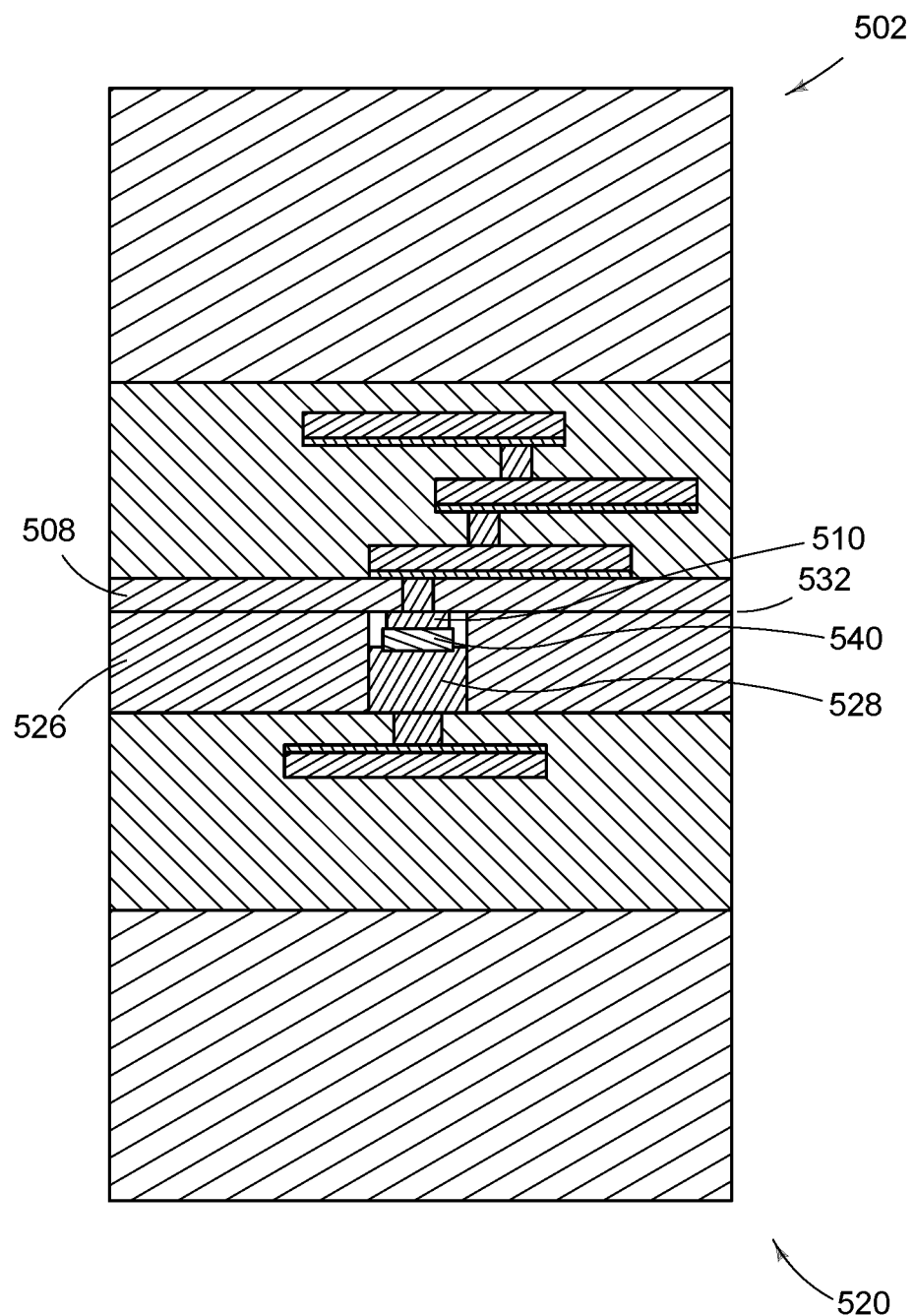
FIG. 5 shows two CMOS wafers bonded together with a shortened standoff according to one aspect of the present embodiments.

Referring now to FIG. 5, two CMOS wafers bonded together with a shortened standoff are shown according to one aspect of the present embodiments. In the present embodiment the height of a standoff 510 has been selected to reduce to zero a standoff height 532 between a first CMOS wafer 502 and a second CMOS wafer 520 after eutectic bonding. Therefore, after forming a eutectic bond 540, facing layers of the first CMOS wafer 502 and the second CMOS wafer 520 are in contact with each other. In the present embodiment a passivation bottom layer 508 of the first CMOS wafer 502 is in contact with a passivation top layer 526 of the second CMOS wafer 520. However, it is understood that other embodiments may include different layers of two CMOS wafers in contact with each other.

The height of the standoff 510 may be selected to achieve a predetermined standoff height 532 between the first CMOS wafer 502 and the second CMOS wafer 520. In one embodiment the height of the standoff 510 may be substantially increased (not shown) to create a much larger standoff height 532 between the first CMOS wafer 502 and the second CMOS wafer 520. In another embodiment, the height of the standoff 510 may be only slightly increased (not shown) to create a very small standoff height 532 between the first CMOS wafer 502 and the second CMOS wafer 520. Therefore, the height of the standoff 510 may be adjusted to achieve a desired standoff height 532.

Furthermore, the depth of the well 528 may be selected to achieve a predetermined standoff height 532 between the first CMOS wafer 502 and the second CMOS wafer 520. In one embodiment the depth of the well 528 may be substantially decreased (not shown) to create a much larger standoff height 532 between the first CMOS wafer 502 and the second CMOS wafer 520. In another embodiment, the depth of the well 528 may be only slightly decreased (not shown) to create a very small standoff height 532 between the first CMOS wafer 502 and the second CMOS wafer 520. Therefore, the depth of the well 528 may be adjusted to achieve a desired standoff height 532.

Figure 6:
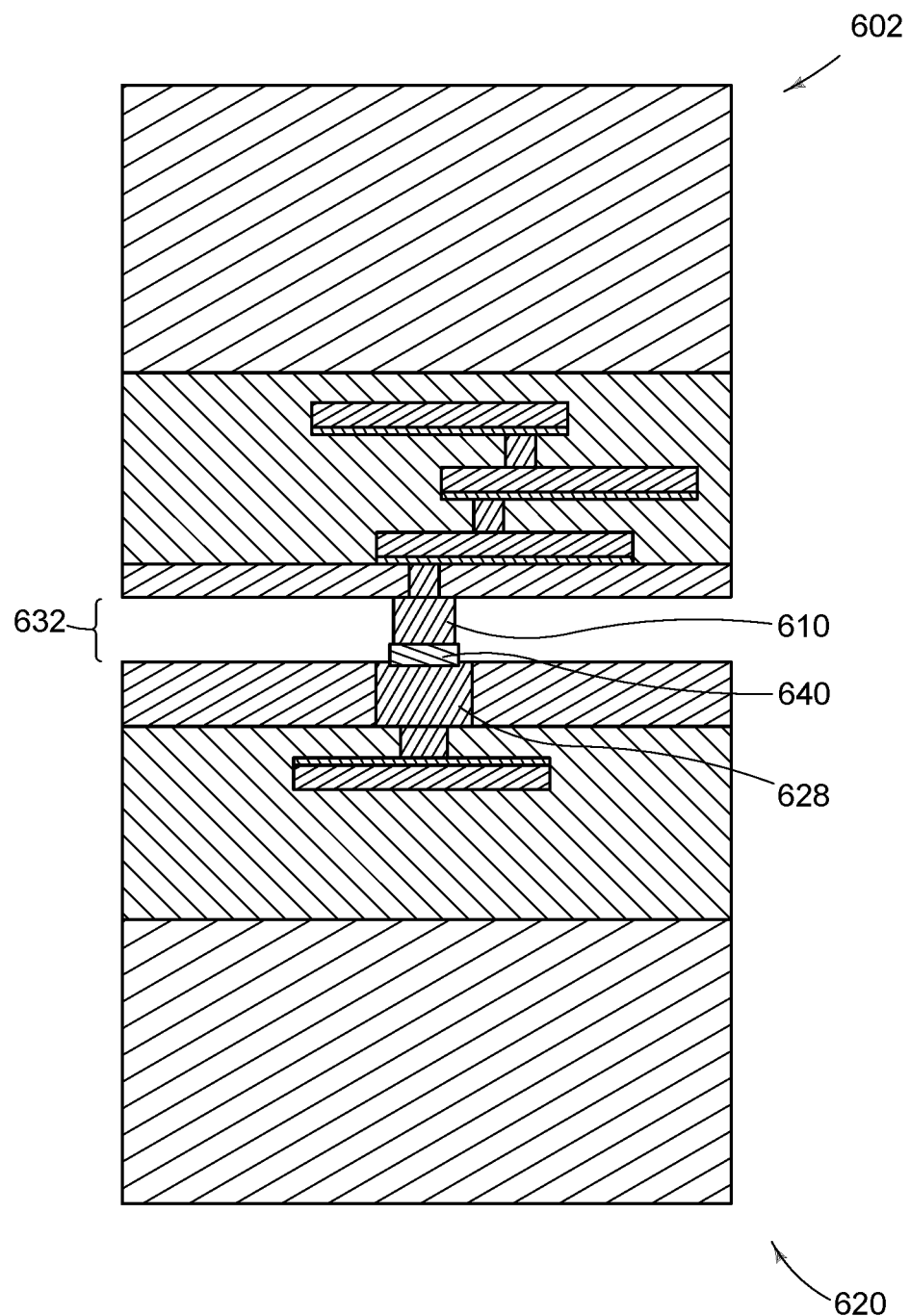
FIG. 6 shows two CMOS wafers bonded together with a standoff and surface pad according to one aspect of the present embodiments.

Referring now to FIG. 6, two CMOS wafers bonded together with a standoff and surface pad are shown according to one aspect of the present embodiments. A first CMOS wafer 602 includes a standoff 610. A second CMOS wafer 620 includes a pad 628 or a surface that is continuous (e.g. flat) with a surface of the second CMOS wafer 620. A eutectic bond 640 interconnects the first CMOS wafer 602 to the second CMOS wafer 620 through the standoff 610 and the pad 628. In the present embodiment, a standoff height 632 is determined by the length of the standoff 610, as previously discussed above with respect to variations in the height of the standoff.

Figure 7:
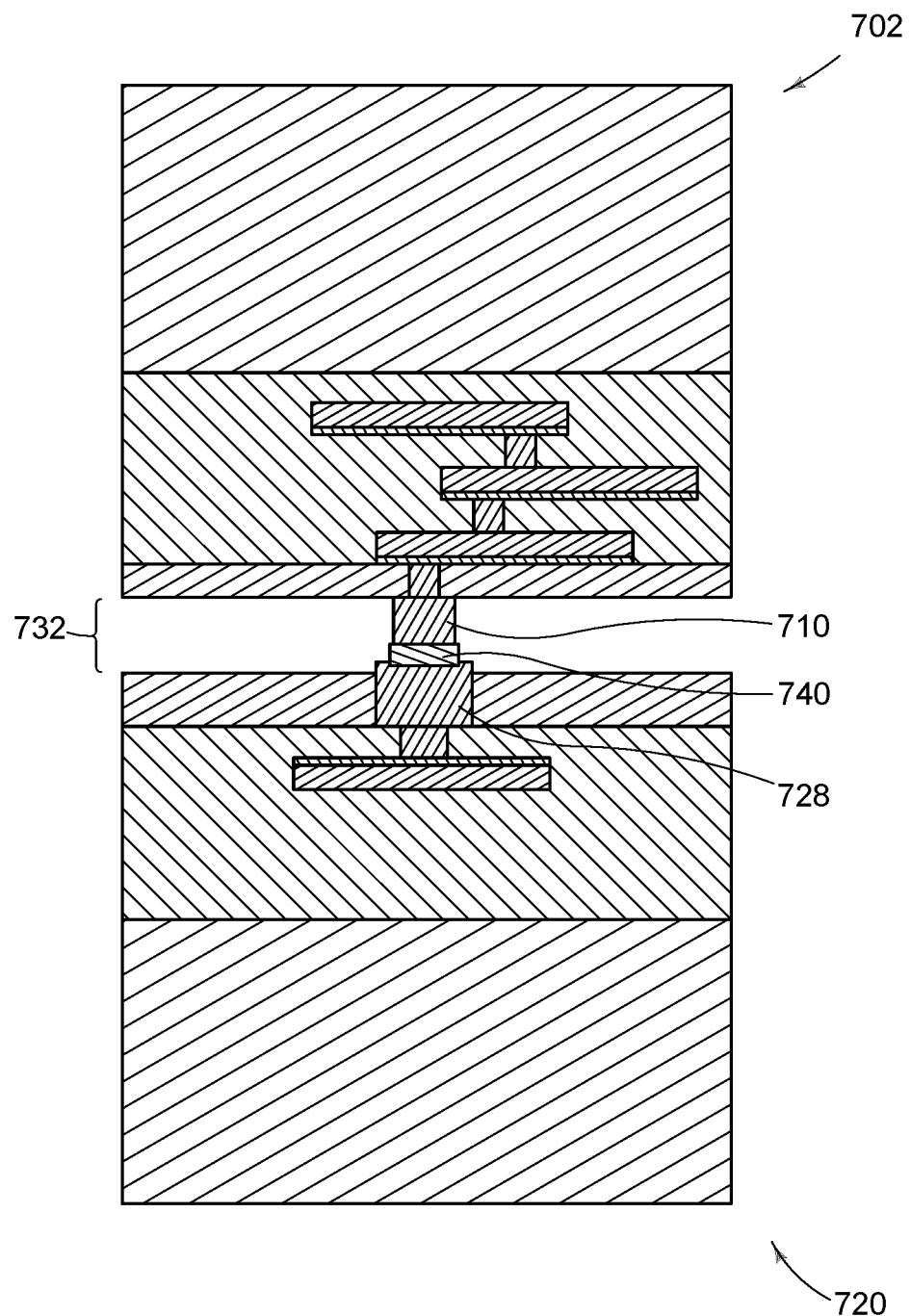
FIG. 7 shows two CMOS wafers bonded together with two opposing standoffs according to one aspect of the present embodiments.

Referring now to FIG. 7, two CMOS wafers bonded together with two opposing standoffs are shown according to one aspect of the present embodiments. A first CMOS wafer 702 includes a first standoff 710. A second CMOS wafer 720 includes a second standoff 728. A eutectic bond 740 interconnects the first CMOS wafer 702 to the second CMOS wafer 720 through the first standoff 710 and the second standoff 728. In the present embodiment, a standoff height 732 is determined by the length of the first standoff 710 and the length of the second standoff 728, as previously discussed above with respect to variations in the height of the standoff.

Figure 8:
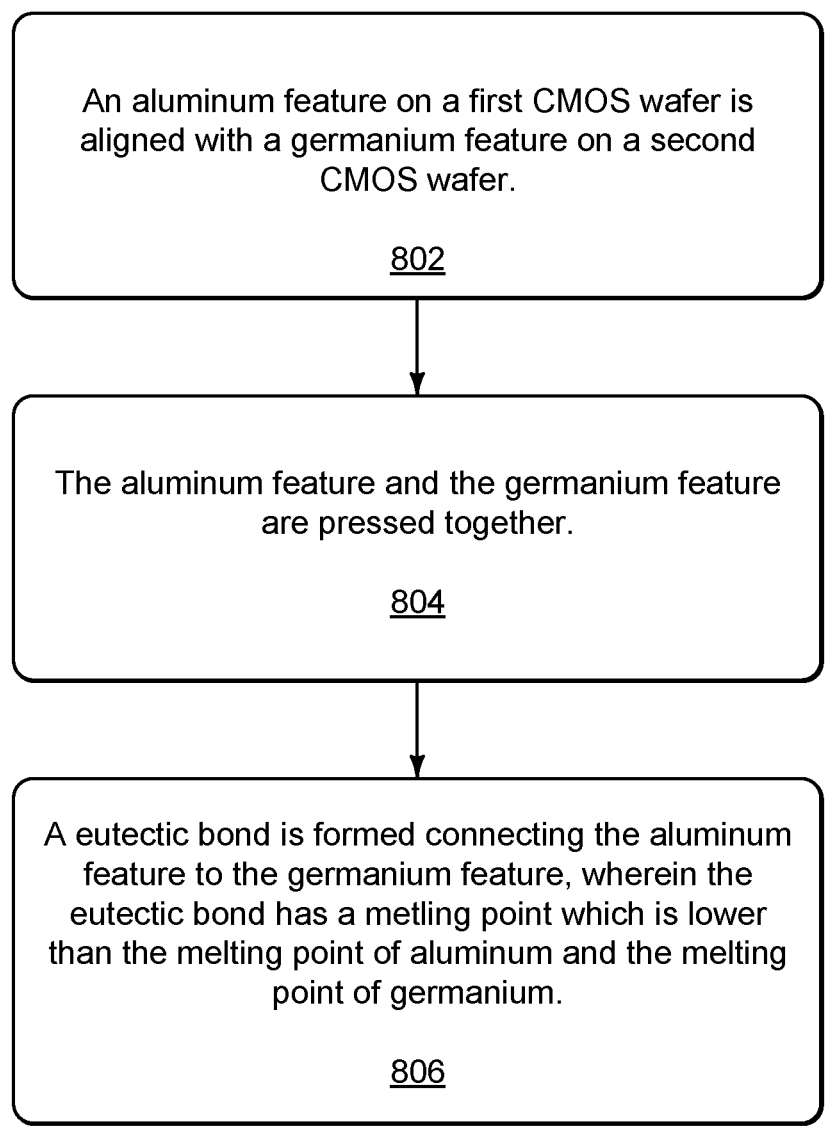
FIG. 8 shows an exemplary flow diagram for forming a eutectic bond between two CMOS wafers according to one aspect of the present embodiments.

FIG. 8 shows an exemplary flow diagram for forming a eutectic bond between two CMOS wafers according to one aspect of the present embodiments. At block 802, a germanium feature on a first CMOS wafer is aligned with an aluminum feature on a second CMOS wafer. For example, in FIG. 1 the standoff of first CMOS wafer is aligned with the well of the second CMOS wafer. The standoff is aluminum with a germanium layer that faces an aluminum well within the passivation layer.

At block 804, the aluminum feature and the germanium feature are pressed together. For example, in FIG. 2 the first CMOS wafer has been pressed together with the second CMOS wafer, such that the aluminum standoff with the germanium layer contacts the aluminum well.

In some embodiments, the germanium feature is a germanium layer on an aluminum standoff. For example, in FIG. 1 the first CMOS wafer also includes an aluminum standoff, below the passivation bottom layer, and the aluminum standoff includes a germanium layer. In other embodiments, the germanium feature is a germanium standoff. For example, in FIG. 2, although the first CMOS wafer includes the aluminum standoff with the germanium layer, and the second CMOS wafer includes the aluminum well, various embodiments may include other combinations. Thus, one embodiment may include a germanium standoff and an aluminum well. Another embodiment may include an aluminum standoff and an aluminum well with a germanium layer. A still further embodiment may include a germanium standoff, a germanium well, and an aluminum layer on either the germanium standoff or the germanium well.

In some embodiments, the aluminum feature is a well within a passivation layer. For example, in FIG. 1 the second CMOS wafer also includes an aluminum well, within the passivation top layer. In some embodiments, the eutectic bond, while melted, is confined to the well. For example, in FIG. 3 sufficient pressure is applied to aid in the eutectic bonding process, however too much pressure may cause melted Al-Ge to spill out of the well and onto the passivation layer. Therefore, the pressure is controlled to maintain the Al-Ge eutectic bond substantially to the contact points between the first CMOS wafer and the second CMOS wafer, thereby confining the eutectic bond to the aluminum well.

At block 806, a eutectic bond is formed connecting the aluminum feature to the germanium feature, wherein the eutectic bond has a melting point which is lower than the melting point of aluminum and the melting point of germanium. For example, in FIG. 3 heat and pressure are applied in order to bring the temperature up to at least the eutectic melting point and form the Al-Ge bond.

In some embodiments, the aluminum feature and the germanium feature are heated to a point below the melting point of the eutectic bond, and after the pressing the aluminum feature and the germanium feature are heated to at least the melting point of the eutectic bond. For example, in FIG. 3 the temperature may be raised in step fashion to below the eutectic melting point, the surfaces brought into contact, and then the temperature raised again.

In some embodiments, a number of additional germanium features on the first CMOS wafer are aligned with a number of additional aluminum features on the second CMOS wafer, wherein, before the pressing, distances are inconsistent between a number of the additional aluminum features and a number of the additional germanium features, and wherein further, after the pressing, the number of additional aluminum features contact the number of additional germanium features. For example, in FIG. 4 the CMOS wafers are not always perfectly flat. As a result, one or more standoffs and wells may contact one another before other standoffs and wells, thereby preventing the other standoffs and wells from contacting. Therefore, additional pressure is applied to the first CMOS wafer and the second CMOS wafer in order to bring all of the standoffs and wells into contact and form the Al-Ge eutectic bonds.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
aligning a germanium feature on a first CMOS wafer with an aluminum feature on a second CMOS wafer;
heating the aluminum feature and the germanium feature to a point below the melting point of a eutectic bond, wherein the aluminum feature is a well within a passivation layer;
pressing together the aluminum feature and the germanium feature;
after the pressing, heating the aluminum feature and the germanium feature to at least the melting point of the eutectic bond;
forming a eutectic bond connecting the aluminum feature to the germanium feature, wherein the eutectic bond has a melting point which is lower than a melting point of aluminum and a melting point of germanium; and
providing an electrical connection from the first CMOS wafer to a solder bump through the eutectic bond, and through a silicon via in the second CMOS wafer.

2. The method of claim 1, further comprising:
aligning a plurality of additional germanium features on the first CMOS wafer with a plurality of additional aluminum features on the second CMOS wafer, wherein before the pressing, distances are inconsistent between a number of the plurality of additional aluminum features and a number of the plurality of additional germanium features, and after the pressing, the plurality of additional aluminum features contact the plurality of additional germanium features.

3. The method of claim 1, wherein the germanium feature is a germanium standoff.

4. The method of claim 1, further comprising confining the eutectic bond, while melted, to the well.

5. A method comprising:

aligning a germanium feature on a first CMOS wafer with an aluminum feature on a second CMOS wafer, wherein
the second CMOS wafer includes a depression within a surface of the second CMOS wafer, and
the depression includes the aluminum feature;

pressing together the aluminum feature and the germanium feature;

forming a eutectic bond connecting the aluminum feature to the germanium feature, wherein the eutectic bond has a melting point which is lower than a melting point of aluminum and a melting point of germanium; and providing an electrical connection from the first CMOS wafer to a solder bump through the eutectic bond, and through a silicon via in the second CMOS wafer.

6. The method of claim 5, further comprising:

heating the aluminum feature and the germanium feature to a point below the melting point of the eutectic bond; and after the pressing, heating the aluminum feature and the germanium feature to at least the melting point of the eutectic bond.

7. The method of claim 5, further comprising:

aligning a plurality of additional germanium features on the first CMOS wafer with a plurality of additional aluminum features on the second CMOS wafer, wherein
before the pressing, distances are inconsistent between a number of the plurality of additional aluminum features and a number of the plurality of additional germanium features, and
after the pressing, the plurality of additional aluminum features contact the plurality of additional germanium features.

8. The method of claim 5, wherein the germanium feature is a germanium standoff.

9. The method of claim 5, wherein the aluminum feature is a well within a passivation layer.

10. The method of claim 9, further comprising confining the eutectic bond, while melted, to the well.

11. A method comprising:

aligning a first feature on a first CMOS wafer with a second feature on a second CMOS wafer, wherein
the first feature is a standoff with a height,
the second feature is a depression with a depth, and
the height is greater than the depth;

pressing together the first feature and the second feature;

forming a eutectic bond connecting the first feature to the second feature, wherein the eutectic bond has a melting point which is lower than a melting point of the first feature and a melting point of the second feature; and providing an electrical connection from the first CMOS wafer to a solder bump through the eutectic bond, and through a silicon via in the second CMOS wafer.

12. The method of claim 11, further comprising:

heating the first feature and the second feature to a point below the melting point of the eutectic bond; and after the pressing, heating the first feature and the second feature to at least the melting point of the eutectic bond.

13. The method of claim 11, wherein the first feature is a germanium feature and the second feature is an aluminum feature.

14. The method of claim 13, further comprising:

aligning a plurality of additional germanium features on the first CMOS wafer with a plurality of additional aluminum features on the second CMOS wafer, wherein
before the pressing, distances are inconsistent between a number of the plurality of additional aluminum features and a number of the plurality of additional germanium features, and
after the pressing, the plurality of additional aluminum features contact the plurality of additional germanium features.

15. The method of claim 11, wherein the first feature is a germanium standoff.

16. The method of claim 11, wherein the second feature is a well within a passivation layer.

17. The method of claim 16, further comprising confining the eutectic bond, while melted, to the well.

18. The method of claim 11, wherein a width of the eutectic bond is narrower than a width of the first feature.

* * * * *